(12) United States Patent
Stevens et al.

(10) Patent No.: US 6,516,815 B1
(45) Date of Patent: Feb. 11, 2003

(54) EDGE BEAD REMOVAL/SPIN RINSE DRY (EBR/SRD) MODULE

(75) Inventors: Joe Stevens, San Jose, CA (US); Donald Olgado, Palo Alto, CA (US); Alex Ko, Sunnyvale, CA (US); Yeuk-Fai Edwin Mok, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/350,212

(22) Filed: Jul. 9, 1999

(51) Int. Cl.[7] .................................................. B08B 3/02

(52) U.S. Cl. ........................ 134/25.4; 134/33; 134/147; 134/153; 134/902

(58) Field of Search ............................... 134/147, 153, 134/902, 94.1, 95.3, 99.1, 103.2, 25.4, 33

(56) References Cited

U.S. PATENT DOCUMENTS

| | | | |
|---|---|---|---|
| 3,727,620 A | 4/1973 | Orr | ........................ 134/95 |
| 3,770,598 A | 11/1973 | Creutz | ...................... 204/52 R |
| 3,772,105 A | 11/1973 | Shipley | ........................ 156/19 |
| 3,953,265 A | * 4/1976 | Hood | |

(List continued on next page.)

FOREIGN PATENT DOCUMENTS

| | | | | |
|---|---|---|---|---|
| DE | 41 09 955 | 10/1992 | ......... | H01L/21/306 |
| DE | 42 02 194 | 7/1993 | ............ | B44D/3/16 |
| FR | 2 623 134 | 11/1987 | ............. | B44C/1/26 |
| JP | 1-316936 | 12/1989 | ......... | H01L/21/306 |

(List continued on next page.)

OTHER PUBLICATIONS

Semitool©, Inc., "Metallization & Interconnect," 1998, 4 pages.
Laurell Technologies Corporation, "Two control configurations available–see *WS 400 OR WS–400Lite*." Oct. 19, 1998, 6 pages.
PCT International Search Report from PCT/US 99/27855, Dated Mar. 27, 200.
R. J. Censak, et al., IBM Technical Disclosure Bulletin, "Spin Basket," vol. 18, No. 8, Jan. 1976, pp. 2476–2477.
Peter Singer, Semiconductor International "Wafer Processing," Jun. 1998, p. 70.
Lucio Colombo, "Wafer Back Surface Film Removal," Central R&D, SGS–Thomson Microelectronics, Agrate, Italy.
Verteq Online, "Products Overview" www.verteq.com.
Peter Singer, Semiconductor International, "Tantalum, Copper and Damascene: The Future of Interconnects," Jun. 1998.

*Primary Examiner*—Frankie L. Stinson
(74) *Attorney, Agent, or Firm*—Moser, Patterson & Sheridan

(57) ABSTRACT

The present invention provides an apparatus for etching a substrate, comprising: a container; a substrate support disposed in the container; a rotation actuator attached to the substrate support; and a fluid delivery assembly disposed in the container to deliver an etchant to a peripheral portion of a substrate disposed on the substrate support. Preferably, the substrate support comprises a vacuum chuck and the fluid delivery assembly comprises one or more nozzles. The invention also provide a method for etching a substrate, comprising: rotating a substrate positioned on a rotatable substrate support; and delivering an etchant to a peripheral portion of the substrate. Preferably, the substrate is rotated at between about 100 rpm and about 1000 rpm, and the etchant is delivered in a direction that is substantially tangent to the peripheral portion of the substrate at an incident angle between about 0 degrees and about 45 degrees from a surface of substrate.

50 Claims, 4 Drawing Sheets

U.S. PATENT DOCUMENTS

| | | | |
|---|---|---|---|
| 3,990,462 A | * 11/1976 | Elftmann et al. | |
| 4,027,686 A | 6/1977 | Shortes et al. | 134/33 |
| 4,092,176 A | 5/1978 | Kozai et al. | 134/186 |
| 4,110,176 A | 8/1978 | Creutz et al. | 204/52 R |
| 4,113,492 A | 9/1978 | Sato et al. | 96/67 |
| 4,315,059 A | 2/1982 | Raistrick et al. | 429/112 |
| 4,326,940 A | 4/1982 | Eckles et al. | 204/232 |
| 4,336,114 A | 6/1982 | Mayer et al. | 204/52 R |
| 4,376,685 A | 3/1983 | Watson | 204/52 R |
| 4,405,416 A | 9/1983 | Raistrick et al. | 204/68 |
| 4,429,983 A | * 2/1984 | Cortellino et al. | |
| 4,435,266 A | 3/1984 | Johnston | 204/276 |
| 4,439,243 A | * 3/1984 | Titus | |
| 4,439,244 A | 3/1984 | Allevato | 134/33 |
| 4,489,740 A | 12/1984 | Rattan et al. | 134/140 |
| 4,510,176 A | * 4/1985 | Cuthbert et al. | |
| 4,518,678 A | 5/1985 | Allen | 430/311 |
| 4,519,846 A | 5/1985 | Aigo | 134/15 |
| 4,633,804 A | * 1/1987 | Arii | |
| 4,688,918 A | * 8/1987 | Suzuki et al. | |
| 4,693,805 A | 9/1987 | Quazi | 204/192.22 |
| 4,732,785 A | 3/1988 | Brewer | 427/240 |
| 4,788,994 A | * 12/1988 | Shinbara | |
| 4,838,289 A | * 6/1989 | Kottman et al. | |
| 5,039,381 A | 8/1991 | Mullarkey | 204/47.5 |
| 5,055,425 A | 10/1991 | Leibovitz et al. | 437/195 |
| 5,092,975 A | 3/1992 | Yamamura et al. | 204/198 |
| 5,155,336 A | 10/1992 | Gronet et al. | 219/411 |
| 5,162,260 A | 11/1992 | Leibovitz et al. | 437/195 |
| 5,176,783 A | * 1/1993 | Yoshikawa | |
| 5,222,310 A | 6/1993 | Thompson et al. | 34/202 |
| 5,224,504 A | 7/1993 | Thompson et al. | 134/155 |
| 5,230,743 A | 7/1993 | Thompson et al. | 134/32 |
| 5,252,807 A | 10/1993 | Chizinsky | 219/390 |
| 5,256,274 A | 10/1993 | Poris | 205/123 |
| 5,259,407 A | 11/1993 | Tuchida et al. | 134/151 |
| 5,290,361 A | 3/1994 | Hayashida et al. | 134/2 |
| 5,316,974 A | 5/1994 | Crank | 437/190 |
| 5,328,589 A | 7/1994 | Martin | 205/296 |
| 5,349,978 A | 9/1994 | Sago et al. | 134/153 |
| 5,351,360 A | * 10/1994 | Suzuki et al. | |
| 5,368,711 A | 11/1994 | Poris | 204/193 |
| 5,377,708 A | 1/1995 | Bergman et al. | 134/105 |
| 5,415,890 A | 5/1995 | Kloiber et al. | 427/242 |
| 5,447,615 A | 9/1995 | Ishida | 204/224 R |
| 5,482,174 A | 1/1996 | Namiki et al. | 216/41 |
| 5,608,943 A | 3/1997 | Konishi et al. | 15/302 |
| 5,625,170 A | 4/1997 | Poris | 177/50 |
| 5,634,980 A | * 6/1997 | Tomita et al. | |
| 5,651,865 A | 7/1997 | Sellers | 204/192.13 |
| 5,705,223 A | 1/1998 | Bunkofske | 427/240 |
| 5,718,813 A | 2/1998 | Drummond et al. | 204/192.12 |
| 5,723,028 A | 3/1998 | Poris | 204/231 |
| 5,753,133 A | * 5/1998 | Wong et al. | |
| 5,783,097 A | * 7/1998 | Lo et al. | |
| 5,879,577 A | * 3/1999 | Weng et al. | |
| 5,897,379 A | * 4/1999 | Ulrich et al. | |
| 5,939,139 A | * 8/1999 | Fujimoto et al. | |
| 5,976,267 A | * 11/1999 | Culkins et al. | |
| 5,997,653 A | * 12/1999 | Yamasaka et al. | |
| 6,017,437 A | 1/2000 | Ting et al. | 205/80 |
| 6,019,843 A | * 2/2000 | Park et al. | |
| 6,062,288 A | * 5/2000 | Tateyama | |
| 6,063,232 A | 5/2000 | Terasawa et al. | 156/345 |
| 6,114,254 A | * 9/2000 | Rolfson | |
| 6,117,778 A | * 9/2000 | Jones et al. | |
| 6,254,760 B1 | 7/2001 | Shen et al. | |
| 6,258,220 B1 | 7/2001 | Dordi et al. | |
| 6,261,433 B1 | 7/2001 | Landau | |
| 6,290,865 B1 | 9/2001 | Lloyd et al. | |
| 6,309,981 B1 | 10/2001 | Mayer et al. | 438/754 |

FOREIGN PATENT DOCUMENTS

| | | | |
|---|---|---|---|
| JP | 2-253620 | * 10/1990 | |
| JP | 2-272738 | * 11/1990 | |
| JP | 3 220723 | 9/1991 | H01L/21/306 |
| JP | 5-13322 | * 1/1993 | |
| JP | 05 160104 | 6/1993 | H01L/21/306 |
| JP | 06017291 | 1/1994 | C25D/7/12 |
| JP | 406097136 | 4/1994 | H01L/21/304 |
| JP | 6-124887 | * 5/1994 | |
| JP | 09017768 | 6/1995 | H01L/21/306 |
| JP | 08037143 | 2/1996 | H01L/21/027 |
| WO | WO 99/25904 | 5/1991 | C25D/5/02 |
| WO | WO 97/12079 | 4/1997 | C25D/5/02 |
| WO | WO 99/25903 | 5/1999 | C25D/5/00 |

* cited by examiner

EDGE BEAD REMOVAL/SPIN RINSE DRY (EBR/SRD) MODULE

BACKGROUND OF THE INVENTION

1. Field of the Invention

The present invention relates to an electro-chemical deposition or electroplating apparatus. More particularly, the invention relates to an apparatus for removing deposition from a peripheral portion of a substrate.

2. Background of the Related Art

Sub-quarter micron, multi-level metallization is one of the key technologies for the next generation of ultra large scale integration (ULSI). The multilevel interconnects that lie at the heart of this technology require planarization of interconnect features formed in high aspect ratio apertures, including contacts, vias, lines and other features. Reliable formation of these interconnect features is very important to the success of ULSI and to the continued effort to increase circuit density and quality on individual substrates and die.

As circuit densities increase, the widths of vias, contacts and other features, as well as the dielectric materials between them, decrease to less than 250 nanometers, whereas the thickness of the dielectric layers remains substantially constant, with the result that the aspect ratios for the features, i.e., their height divided by width, increases. Many traditional deposition processes, such as physical vapor deposition (PVD) and chemical vapor deposition (CVD), have difficulty filling structures where the aspect ratio exceed 4:1, and particularly where it exceeds 10:1.Therefore, there is a great amount of ongoing effort being directed at the formation of void-free, nanometer-sized features having high aspect ratios wherein the ratio of feature height to feature width can be 4:1 or higher. Additionally, as the feature widths decrease, the device current remains constant or increases, which results in an increased current density in the feature.

Elemental aluminum (Al) and its alloys have been the traditional metals used to form lines and plugs in semiconductor processing because of aluminum's perceived low electrical resistivity, its superior adhesion to silicon dioxide ($SiO_2$), its ease of patterning, and the ability to obtain it in a highly pure form. However, aluminum has a higher electrical resistivity than other more conductive metals such as copper, and aluminum also can suffer from electromigration leading to the formation of voids in the conductor.

Copper and its alloys have lower resistivities than aluminum and significantly higher electromigration resistance as compared to aluminum. These characteristics are important for supporting the higher current densities experienced at high levels of integration and increase device speed. Copper also has good thermal conductivity and is available in a highly pure state. Therefore, copper is becoming a choice metal for filling sub-quarter micron, high aspect ratio interconnect features on semiconductor substrates.

Despite the desirability of using copper for semiconductor device fabrication, choices of fabrication methods for depositing copper into very high aspect ratio features, such as a 4:1, having 0.35 $\mu$ (or less) wide vias are limited. As a result of these process limitations, plating, which had previously been limited to the fabrication of lines on circuit boards, is just now being used to fill vias and contacts on semiconductor devices.

Metal electroplating is generally known and can be achieved by a variety of techniques. A typical method generally comprises physical vapor depositing a barrier layer over the feature surfaces, physical vapor depositing a conductive metal seed layer, preferably copper, over the barrier layer, and then electroplating a conductive metal over the seed layer to fill the structure/feature. Finally, the deposited layers and the dielectric layers are planarized, such as by chemical mechanical polishing (CMP), to define a conductive interconnect feature.

FIG. 1 is a cross sectional view of a simplified typical fountain plater 10 incorporating contact pins. Generally, the fountain plater 10 includes an electrolyte container 12 having a top opening, a substrate holder 14 disposed above the electrolyte container 12, an anode 16 disposed at a bottom portion of the electrolyte container 12 and a contact ring 20 contacting the substrate 22. A plurality of grooves 24 are formed in the lower surface of the substrate holder 14. A vacuum pump (not shown) is coupled to the substrate holder 14 and communicates with the grooves 24 to create a vacuum condition capable of securing the substrate 22 to the substrate holder 14 during processing. The contact ring 20 comprises a plurality of metallic or semimetallic contact pins 26 distributed about the peripheral portion of the substrate 22 to define a central substrate plating surface. The plurality of contact pins 26 extend radially inwardly over a narrow perimeter portion of the substrate 22 and contact a conductive seed layer of the substrate 22 at the tips of the contact pins 26. A power supply (not shown) is attached to the pins 26 thereby providing an electrical bias to the substrate 22. The substrate 22 is positioned above the cylindrical electrolyte container 12 and electrolyte flow impinges perpendicularly on the substrate plating surface during operation of the cell 10.

One particular problem encountered in current electroplating processes is that the edge of the seed layer receives an excess amount of deposition, typically referred to as an edge bead, during the electroplating process. FIG. 2 is a cross sectional view of an edge of an wafer 30 showing excess deposition 36 at the edge 32 of the seed layer 34. As shown in FIG. 2, the wafer 30 has a seed layer 32 deposited thereon and an electroplated layer 38 electrochemically deposited over the seed layer 34. It has been observed that the edge 32 of the seed layer 34 receives a higher current density than the remainder of the seed layer 34, resulting in a higher rate of deposition at the edge 32 of the seed layer 34. The mechanical stress at the edge 32 of the seed layer 34 is also higher than the remainder of the seed layer, causing the deposition at the edge of the seed layer to pull up and away from the edge of the wafer 30. The excess deposition 36 is typically removed by a CMP process. However, during the CMP process, the excess deposition 36 at the edge of the wafer typically tears off from the edge of the seed layer and may damage the adjacent portion of the wafer. The broken off metal may also damage the devices formed on the wafer. Thus, the number of properly formed devices is decreased and the cost per device formed is increased.

Therefore, there is a need for an apparatus for removing the excess deposition at the edge of the wafer. Preferably, the apparatus removes the excess deposition at the edge of the wafer without damaging the devices formed on the wafer surface. It would be further desirable for the apparatus to be adaptable for performing a wafer cleaning process after the excess deposition has been removed from the wafer, such as a spin-rinse-dry process.

SUMMARY OF THE INVENTION

The invention generally provides an apparatus and a method for removing deposition at the edge of a wafer. The apparatus according to the invention removes deposition at the edge of a wafer without damaging the devices formed on the wafer surface.

One aspect of the invention provides an apparatus for etching a substrate, comprising: a container; a substrate support disposed in the container; a rotation actuator attached to the substrate support; and a fluid delivery assembly disposed in the container to deliver an etchant to a peripheral portion of a substrate disposed on the substrate support. Preferably, the substrate support comprises a vacuum chuck and the fluid delivery assembly comprises one or more nozzles.

Another aspect of the invention provide a method for etching a substrate, comprising: rotating a substrate positioned on a rotatable substrate support; and delivering an etchant to a peripheral portion of the substrate. Preferably, the substrate is rotated at between about 100 rpm and about 1000 rpm, and the etchant is delivered in a direction that is substantially tangent to the peripheral portion of the substrate at an incident angle between about 0 degrees and about 45 degrees from a surface of substrate.

Another aspect of the invention provides an apparatus for removing the excess deposition at the edge of the wafer that is adaptable for performing a wafer cleaning process after the excess deposition has been removed from the wafer, such as a spin-rinse-dry process. The apparatus comprises a container; a substrate support disposed in the container; a rotation actuator attached to the substrate support; and a fluid delivery assembly disposed in the container to selectively deliver an etchant to a peripheral portion of a substrate disposed on the substrate support and a rinsing fluid, such as deionized water, to the surface of the substrate.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
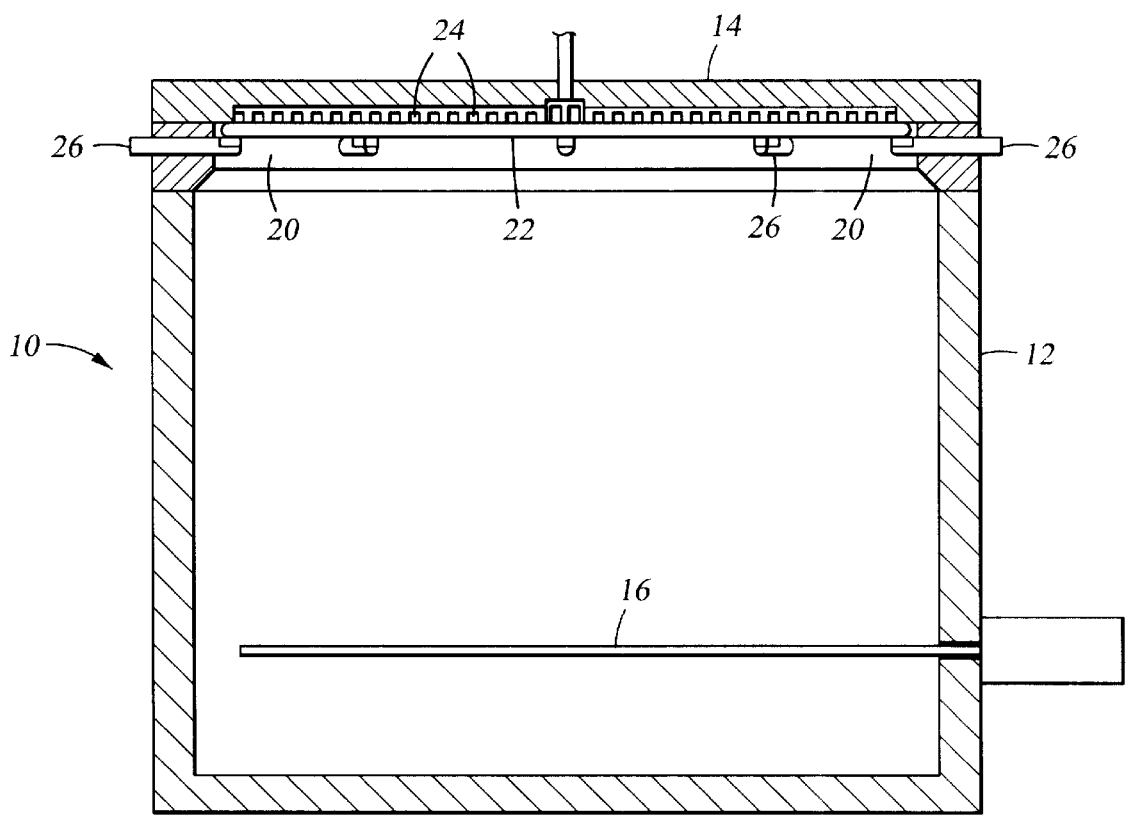
FIG. 1 is a cross sectional view of a simplified typical fountain plater 10 incorporating contact pins.
Figure 2:
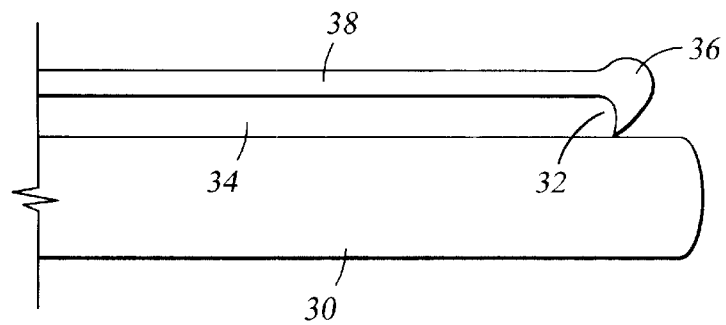
FIG. 2 is a cross sectional view of an edge of an wafer 30 showing excess deposition 36 at the edge 32 of the seed layer 34.
Figure 3:
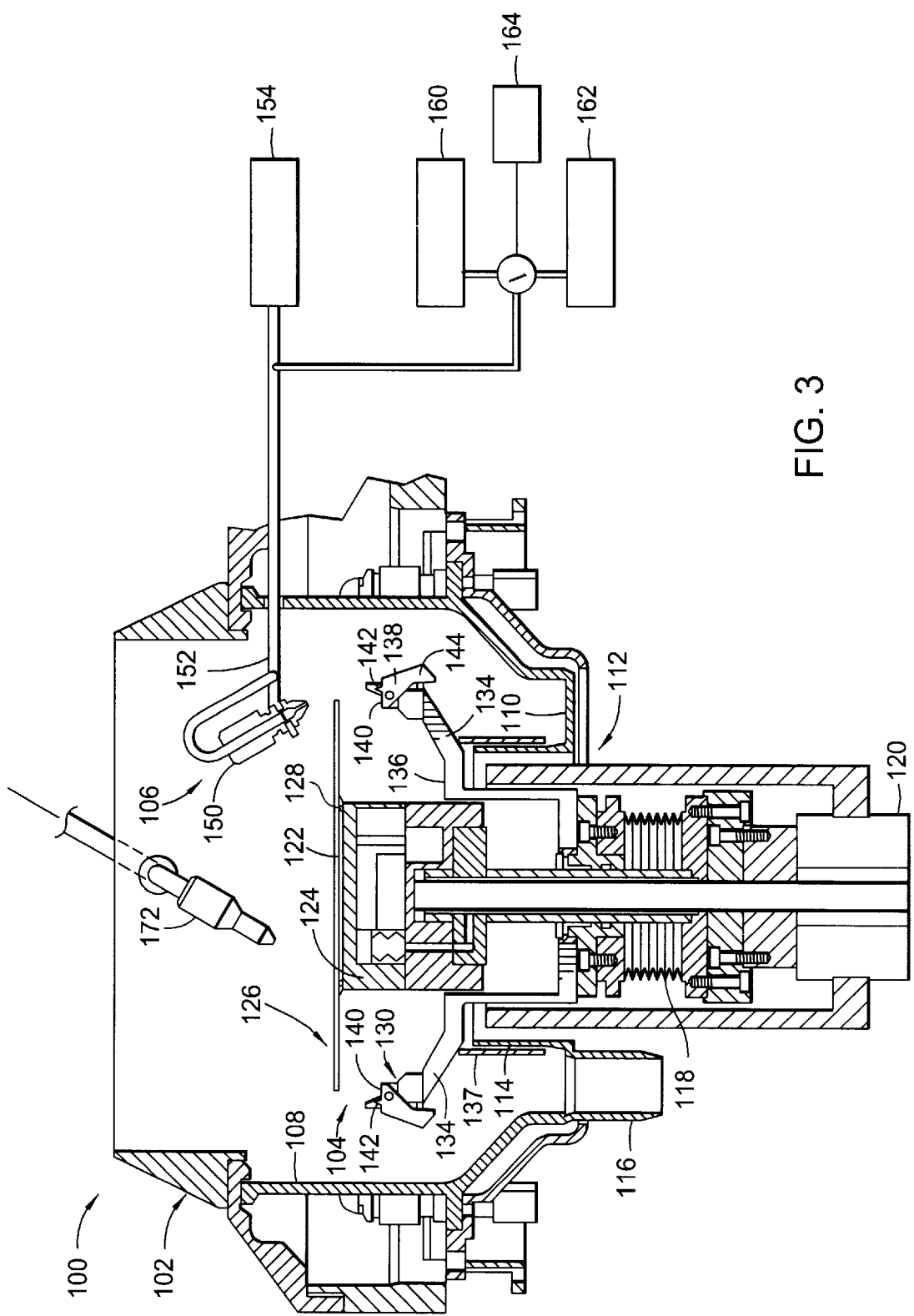
FIG. 3 is a side cross sectional view of an edge bead removal (EBR) module of the present invention showing a substrate disposed in a processing position for removing excess deposition from the edge of the substrate.

FIG. 3 is a side cross sectional view of an edge bead removal (EBR) module of the present invention showing a substrate disposed in a processing position for removing excess deposition from the edge of the substrate. The EBR module 100 can be a stand-alone unit or disposed as a component of an electrochemical deposition system or other deposition systems. The EBR module 100 comprises a container 102, a wafer holder assembly 104 and a fluid/chemical delivery assembly 106. The container 102 preferably includes a cylindrical sidewall 108, a container bottom 110 having a central opening 112, and an upturned inner wall 114 extending upwardly from the peripheral edge of the central opening 112. A fluid outlet 116 is connected to the container bottom 110 to facilitate draining of the used fluids and chemicals from the EBR module 100.

The wafer holder assembly 104 is disposed above the central opening 112 and includes a lift assembly 118 and a rotation assembly 120 that extends through the central opening 112. The lift assembly 118 preferably comprises a bellows-type lift or a lead-screw stepper motor type lift assembly, which are well known in the art and commercially available. The lift assembly 118 facilitates transfer and positioning of the wafer 122 on the wafer holder assembly 104 between various vertical positions. The rotation assembly 120 preferably comprises a rotary motor that is attached below the lift assembly. The rotation assembly 120 rotates the wafer 122 during the edge bead removal process.

The wafer holder assembly 104 preferably comprises a vacuum chuck 124 that secures a wafer 122 from the wafer backside and does not obstruct the wafer edge 126. Preferably, an annular seal 128, such as a compressible O-ring, is disposed at a peripheral portion of the vacuum chuck surface to seal the vacuum chuck 124 from the fluids and chemicals used during the edge bead removal process. The wafer holder assembly 104 preferably includes a wafer lift 130 that facilitates transfer of a wafer from a robot blade of a transfer robot onto the wafer holder assembly 104. The wafer lift 130, as shown in FIG. 3, comprises a spider clip assembly that also can be used to secure a wafer during a spin-rinse-dry process. The spider clip assembly comprises a plurality of arms 134 extending from an annular base 136 and a spider clip 138 pivotally disposed at the distal end of the arm 134. The annular base 136 includes a downwardly extending wall 137 that overlaps the upturned inner wall 114 to contain fluids used during processing inside the container 102. The spider clip 138 includes an upper surface 140 for receiving the wafer, a clamp portion 142 for clamping the wafer, and a lower portion 144 that causes the clamp portion 142 to engage the edge of the wafer due to centrifugal force when the wafer holder assembly is rotated. Alternatively, the wafer lift 130 comprises commonly used wafer lifts in various wafer processing apparatus, such as a set of lift pins or a lift hoop disposed on a lift platform or lift ring in or around the vacuum chuck body.

The fluid/chemical delivery assembly 106 comprises one or more nozzles 150 disposed on one or more dispense arms 152. The dispense arm 152 extends through the container sidewall 108 and is attached to an actuator 154 that extends and retracts to vary the position of the nozzle 150 over the substrate 122. By having an extendable dispense arm 152, the nozzle can be positioned over the wafer to point the nozzle from an interior portion of the wafer toward the edge of the wafer, which enhances the control over the delivery of the etchant/fluids to the wafer edge. Alternatively, the dispense arm 152 is fixedly attached to the container sidewall 108, and the nozzle 150 is secured to the dispense arm in a position that does not interfere with vertical wafer movement in the container 102.

Preferably, the dispense arm 152 includes one or more conduits extending through the dispense arm for connecting the nozzle 150 to an etchant source. A variety of etchants are well known in the art for removing deposited metal from a substrate, such as nitric acid and other acids available commercially. Alternatively, the nozzle 150 is connected through a flexible tubing 156 disposed through the conduit in the dispense arm 152. Preferably, the nozzles 150 are disposed in a paired arrangement at positions above and below the wafer to deliver fluids/chemicals to the upper edge surface and the lower edge surface of the wafer, respectively. The nozzles 150 can be selectively connected to one or more chemical/fluid sources, such as a deionized water source 160 and an etchant source 162, and a computer control 164 switches the connection between the one or more fluid/chemical sources according to a desired program. Alternatively, a first set of nozzles are connected to the deionized water source and a second set of nozzles are connected to the etchant source, and the nozzles are selectively activated to provide fluids to the wafer.

Figure 4:
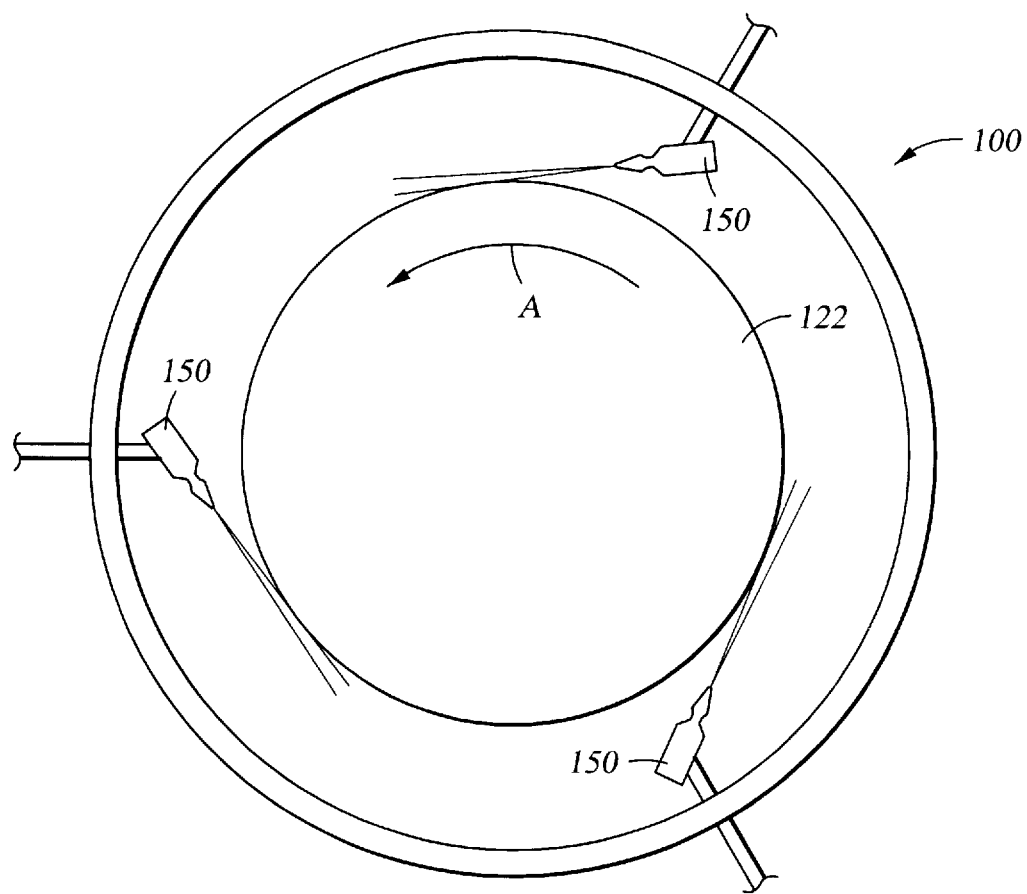
FIG. 4 is a top schematic view of an EBR module illustrating one embodiment of the nozzle positions for edge bead removal.
Figure 5:
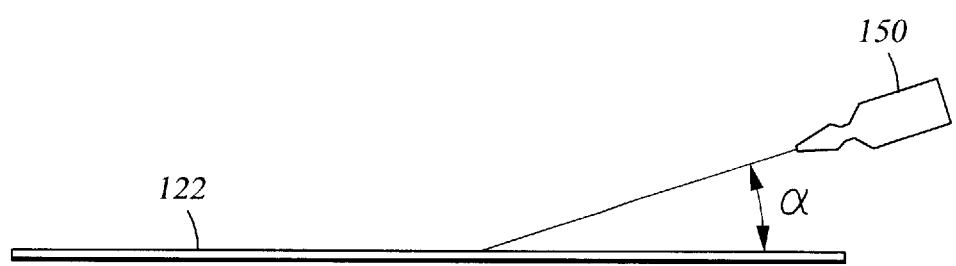
FIG. 5 is a side view of a nozzle 150 disposed in relation to a wafer 122 being processed.

Preferably, the nozzles 150 are disposed at an angled to provide fluids near a peripheral portion of the wafer at a substantially tangential direction. FIG. 4 is a top schematic view of an EBR module illustrating one embodiment of the nozzle positions for edge bead removal. As shown, three nozzles 150 are disposed substantially evenly spaced about an interior surface of the container sidewall 108. Each nozzle 150 is disposed to provide fluids to an edge portion of the wafer and is positioned to provide sufficient space to allow vertical wafer movement between a processing position and a transfer position. Preferably, the fluid delivery or spray pattern is controlled by the shape of the nozzle and the fluid pressure to limit fluid delivery to a selected edge exclusion range. For example, the etchant is restricted to an outer 3 mm annular portion of the wafer to achieve 3 mm edge exclusion. The nozzles are positioned to provide the etchant at an angle of incidence to the surface of the wafer that controls splashing of the etchant as the etchant comes into contact with the wafer. FIG. 5 is a side view of a nozzle 150 disposed in relation to a wafer 122 being processed. Preferably, the angle of incidence, $\alpha$, of the etchant to the wafer is between about 0 degrees and about 45 degrees, more preferably between about 10 degrees and about 30 degrees.

The wafer 122 is rotated during the edge bead removal process to provide substantially equal exposure to the etchant at the peripheral portion of the wafer. Preferably, the wafer 122 is rotated in the same direction as the direction of the etchant spray pattern to facilitate controlled edge bead removal. For example, as shown in FIG. 4, the wafer is rotated in a counterclockwise direction (arrow A) which corresponds to the counter-clockwise spray pattern. The wafer is preferably rotated between about 100 rpm to about 1000 rpm, more preferably between about 500 rpm and about 700 rpm. The effective etch rate (i.e., the amount of copper removed divided by the time required for removal) is a function of the etch rate of the etchant, the velocity of the etchant contacting the wafer edge, the temperature of the etchant, and the velocity of the wafer rotation. These parameters can be varied to achieve particular desired results.

In operation, a wafer 122 is positioned above the wafer holder assembly 104 of the EBR module 100, and the wafer lift 130 lifts the wafer off of a transfer robot blade. The robot blade retracts and the wafer lift 130 lowers the wafer onto the vacuum chuck 124. The vacuum system is activated to secure the wafer 122 thereon, and the wafer holder assembly 104 with the wafer disposed thereon is rotated as the nozzles 150 deliver the etchant onto the peripheral portion of the wafer 122. The etching process is performed for a predetermined time period sufficient to remove the excess deposition on the wafer edge (i.e., edge bead). The wafer is preferably cleaned utilizing deionized water in a spin-rinse-dry process. The spin-rinse-dry process typically involves delivering deionized water to the wafer to rinse residual etchant from the wafer and spining the wafer at a high speed to dry the wafer. The wafer is then transferred out of the EBR module 100 after the edge bead removal process and the spin-rinse-dry process, and the wafer is ready for other processes, such as a thermal anneal treatment and other wafer processing.

Figure 6:
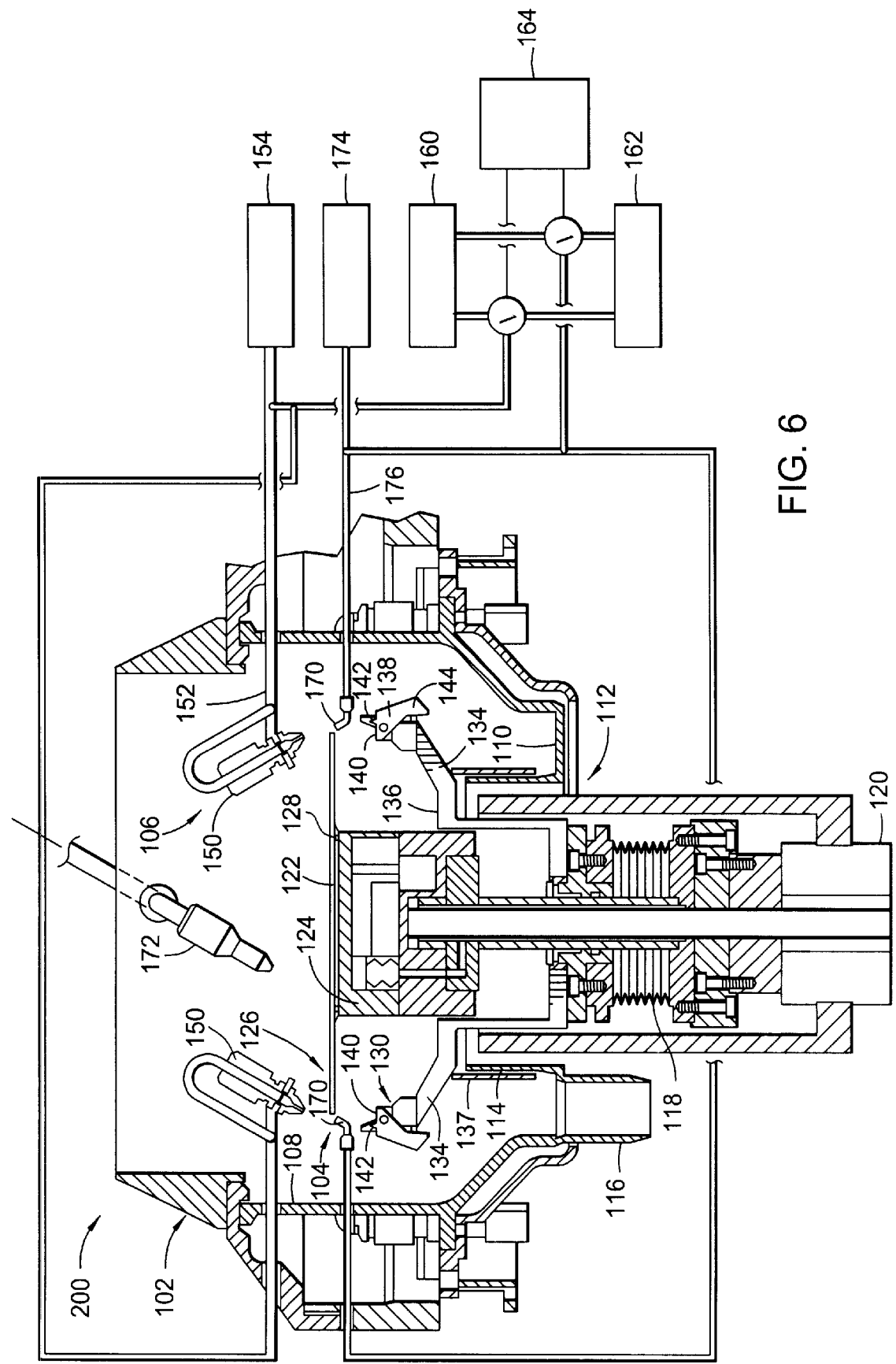
FIG. 6 is a cross sectional view of a combined edge bead removal/spin-rinse-dry (EBR/SRD) module showing a substrate in a processing position vertically disposed between fluid inlets.

FIG. 6 is a cross sectional view of a combined edge bead removal/spin-rinse-dry (EBR/SRD) module showing a substrate in a processing position vertically disposed between fluid inlets. This embodiment of the invention is useful for both edge bead removal (EBR) and spin-rinse-dry (SRD) processes. The components of the EBR/SRD module 200 are similar to the components of the EBR module 100 described above, and the same components are indicated by the same numbers. In addition to the components of the EBR module 100, the EBR/SRD module 200 comprises an additional set of lower nozzles 170 disposed at a position below the wafer, preferably vertically aligned correspondingly to the positions of nozzles 150. The lower nozzles 170 are selectively connected to a deionized water source 160 and an etchant source 162, and the fluid delivered by the nozzles 170 is controlled by the controller 164. Preferably, the nozzles 170 are directed to deliver fluids to a peripheral portion of the backside of the wafer. The lower nozzles 170 are preferably disposed at positions that do not interfere with the movement of the wafer lift 130. The lower nozzle 170 can also be attached to an actuator 174 through an arm 176 that retracts and extends to position the nozzles 170 at desired locations. Alternatively, the wafer lift 130 is not rotated during processing to prevent interference with the lower nozzles 170. The EBR/SRD module 200 preferably also include a dedicated deionized water nozzle 172 disposed to deliver deionized water to a central portion of the upper surface of the wafer.

In operation, the nozzles 150 and 170 deliver an etchant to the peripheral portion of the wafer, including the upper and lower surfaces of the wafer, to perform an edge bead removal process. Preferably, the deionized water nozzle 172 delivers deionized water to the central portion of the wafer during the edge bead removal process to prevent unintended etching by the etchant that has splashed onto a central portion of the wafer surface. For a spin-rinse-dry process, preferably all of the nozzles 150, 170 and 172 delivers deionized water to rinse the wafer as the wafer rotates. After the wafer has been rinsed, the wafer is spun dry and transferred out of the EBR/SRD module 200 for further processing.

While the foregoing is directed to the preferred embodiment of the present invention, other and further embodiments of the invention may be devised without departing from the basic scope thereof, and the scope thereof is determined by the claims that follow.

What is claimed is:

1. An apparatus for etching a substrate, comprising:
   a container;
   a substrate support disposed in the container;
   a rotation actuator attached to the substrate support;
   a fluid delivery assembly disposed in the container to deliver an etchant to a peripheral portion of a substrate disposed on the substrate support, wherein the fluid delivery assembly comprises one or more angled nozzles; and a substrate lift assembly disposed in the container comprising a lift platform and a plurality of arms extending radially from the lift platform.

2. The apparatus of claim 1 wherein the substrate support comprises a vacuum chuck.

3. The apparatus of claim 1 wherein the one or more angled nozzles deliver the etchant to the peripheral portion of the substrate at an angle of incidence less than about 45 degrees.

4. The apparatus of claim 3 wherein the one or more angled nozzles deliver the etchant to a peripheral portion of the substrate at an angle of incidence between about 10 and about 30 degrees.

5. The apparatus of claim 1 wherein the fluid delivery system is selectively connected between an etchant source and a deionized water source.

6. The apparatus of claim 1 wherein the one or more angled nozzles comprises a first set of nozzles connectable to an etchant source and a second set of nozzles connectable to a deionized water source.

7. The apparatus of claim 1 further comprising a deionized water nozzle disposed in the container to deliver deionized water to a central portion of the substrate.

8. The apparatus of claim 1 wherein the substrate lift assembly comprises a plurality of clips disposed at distal ends of the arms.

9. A method for etching a substrate, comprising:
rotating a substrate utilizing a rotatable substrate support comprising a substrate lift assembly having a lift platform and a plurality of arms extending radially from the lift platform;
delivering an etchant to a peripheral portion of the substrate utilizing a fluid delivery assembly having one or more angled nozzles;
delivering a rinsing agent to the substrate after etching; and
spin drying the substrate.

10. The method of claim 9 wherein the substrate is rotated at between about 100 rpm and about 1000 rpm.

11. The method of claim 9 wherein the etchant is delivered in a direction that is substantially tangent to the peripheral portion of the substrate.

12. The method of claim 9 wherein the etchant is delivered to a surface of the substrate at an angle of incidence less than about 45 degrees.

13. The method of claim 9 wherein the etchant is delivered to a front side and a back side of the substrate.

14. The method of claim 9 further comprising delivering deionized water to a central portion of the substrate.

15. An apparatus for delivering an etchant to a peripheral edge of a substrate, comprising:
an enclosure having a substrate support and a rotation actuator attached to the substrate support;
a fluid delivery assembly comprising at least one angled nozzle disposed about a peripheral edge of the substrate; and
a substrate lift assembly connected to the substrate support, wherein the substrate lift assembly comprises a plurality of arms extending radially from a lift platform and a plurality of clips disposed at distal ends of the arms.

16. The apparatus of claim 15 wherein the substrate support comprises a vacuum chuck.

17. The apparatus of claim 15 wherein the at least one angled nozzle delivers the etchant to a peripheral portion of the substrate at an angle of incidence less than about 45 degrees.

18. The apparatus of claim 15 wherein the fluid delivery system is selectively connected between an etchant source and a deionized water source.

19. The apparatus of claim 15 wherein the at least one angled nozzle comprises a first set of angled nozzles connectable to an etchant source and a second set of angled nozzles connectable to a deionized water source.

20. The apparatus of claim 15 further comprising a deionized water nozzle to deliver deionized water to a central portion of the substrate.

21. The apparatus of claim 15 wherein the at least one angled nozzle delivers the etchant to a peripheral portion of the substrate at an angle of incidence between about 10 and about 30 degrees.

22. An apparatus for etching a substrate, comprising:
an enclosure having a substrate support and a rotation actuator attached to the substrate support;
a delivery assembly comprising at least one nozzle to deliver a fluid to a peripheral edge of a substrate at an angle of incidence of less than about 45 degrees; and
a substrate lift assembly disposed in the enclosure comprising a lift platform and a plurality of arms extending radially from the lift platform.

23. The apparatus of claim 22, wherein the delivery assembly comprises a first set of nozzles connectable to an etchant source and a second set of nozzles connectable to a deionized water source.

24. The apparatus of claim 23, wherein the second fluid source comprises deionized water.

25. The apparatus of claim 23, wherein the first fluid source comprises an etchant.

26. The apparatus of claim 23, wherein the delivery assembly comprises at least one pair of vertically aligned nozzles.

27. The apparatus of claim 22, wherein the fluid delivery assembly delivers the fluid to an upper peripheral edge of the substrate.

28. The apparatus of claim 22, wherein the fluid delivery assembly delivers the fluid to a lower peripheral edge of the substrate.

29. The apparatus of claim 22, wherein the fluid delivery assembly delivers the fluid to upper and lower peripheral edges of the substrate.

30. The apparatus of claim 22, further comprising means for spin drying the substrate.

31. The apparatus of claim 22, wherein the substrate is rotated during the delivery of the fluid.

32. The apparatus of claim 22 wherein the at least one nozzle delivers the fluid to a peripheral edge of the substrate at an angle of incidence between about 10 and about 30 degrees.

33. An apparatus for etching a substrate, comprising:
means for supporting a substrate;
means for lifting the substrate, wherein the means for lifting comprises a lift platform and a plurality of arms extending radially from the lift platform;
means for rotating the substrate; and
a delivery assembly for delivering a fluid to a peripheral edge of a substrate disposed on the means for supporting a substrate, wherein the delivery system comprises at least one pair of nozzles connectable to a first fluid source and at least one pair of nozzles connectable to a second fluid source.

34. The apparatus of claim 33, further comprising means for spin drying the substrate.

35. The apparatus of claim 33, wherein the first fluid source comprises an etchant.

36. The apparatus of claim 33, wherein the second fluid source comprises deionized water.

37. The apparatus of claim 33, wherein the fluid is delivered to an upper and lower surface of the substrate at an angle of incidence less than about 45 degrees.

38. The apparatus of claim 33, wherein the fluid is delivered in the direction of the rotation of the substrate.

39. The apparatus of claim 33, wherein the fluid is delivered to an upper surface of the substrate at an angle of incidence less than about 45 degrees.

40. The apparatus of claim 33, wherein the nozzles of each pair are vertically aligned.

41. The apparatus of claim 33, wherein the fluid is delivered to upper and lower surfaces of the substrate at an angle of incidence between about 10 and about 30 degrees.

42. An apparatus for etching a substrate, comprising:

an enclosure having a substrate support and a rotation actuator attached to the substrate support;

a delivery assembly for delivering fluids to a peripheral edge of a substrate disposed on the substrate support, wherein the delivery system comprises at least one set of first angled nozzles connectable to a first fluid source and at least one set of second angled nozzles connectable to a second fluid source; and a substrate lift assembly disposed in the enclosure comprising a lift platform and a plurality of arms extending radially from the lift platform.

43. The apparatus of claim 42, wherein the at least one set of first angled nozzle delivers a first fluid to an upper peripheral edge of the substrate at an angle of incidence less than about 45 degrees.

44. The apparatus of claim 43, wherein the at least one set of second angled nozzles delivers a second fluid to a lower peripheral edge of the substrate.

45. An apparatus for etching a substrate, comprising:

an enclosure having a substrate support and a rotation actuator attached to the substrate support;

a delivery assembly for delivering a fluid to a peripheral edge of a substrate disposed on the substrate support, wherein the delivery system comprises a first set of angled nozzles disposed above an upper surface of the substrate and a second set of angled nozzles disposed below a lower surface of the substrate; and a substrate lift assembly disposed in the enclosure comprising a lift platform and a plurality of arms extending radially from the lift platform.

46. The apparatus of claim 42, wherein the first and second set of angled nozzles are each connectable to a first fluid source, a second fluid source, or both fluid sources.

47. The apparatus of claim 42, wherein the angled nozzles deliver the fluid to a peripheral portion of the substrate at an angle of incidence less than about 45 degrees.

48. An apparatus for etching a substrate, comprising:

an enclosure having a substrate support and a rotation actuator attached to the substrate support;

a delivery assembly for delivering a fluid to a peripheral edge of a substrate disposed on the substrate support, wherein the delivery system comprises at least one angled nozzle disposed above an upper surface of the substrate and at least one angled nozzle disposed below a lower surface of the substrate, wherein the angled nozzles deliver the fluid to a peripheral portion of the substrate at an angle of incidence less than about 45 degrees; and a substrate lift assembly disposed in the enclosure comprising a lift platform and a plurality of arms extending radially from the lift platform.

49. The apparatus of claim 48 wherein the angled nozzles deliver the fluid to a peripheral edge of the substrate at an angle of incidence between about 10 and about 30 degrees.

50. The apparatus of claim 48, wherein the angled nozzles are each connectable to a first fluid source, a second fluid source, or both fluid sources.

* * * * *